US006083767A

United States Patent [19]

Tjaden et al.

[11] Patent Number: 6,083,767

[45] Date of Patent: Jul. 4, 2000

[54] METHOD OF PATTERNING A SEMICONDUCTOR DEVICE

[75] Inventors: Kevin Tjaden; David H. Wells, both of Boise, Id.

[73] Assignee: Micron Technology, Inc., Boise, Id.

[21] Appl. No.: 09/084,458

[22] Filed: May 26, 1998

[51] Int. Cl.[7] .......... H01L 21/00

[52] U.S. Cl. .......... 438/20; 445/24; 445/49; 445/50

[58] Field of Search .......... 438/20; 445/24, 445/49, 50; 427/458; 216/11; 257/163

[56] References Cited

U.S. PATENT DOCUMENTS

| | | | |
|---|---|---|---|
| 4,407,695 | 10/1983 | Deckman et al. | 156/643 |
| 4,554,727 | 11/1985 | Deckman et al. | 29/572 |
| 5,026,657 | 6/1991 | Lee et al. . | |
| 5,342,477 | 8/1994 | Cathey . | |
| 5,374,868 | 12/1994 | Tjaden et al. . | |
| 5,399,238 | 3/1995 | Kumar . | |
| 5,410,218 | 4/1995 | Hush . | |
| 5,425,392 | 6/1995 | Thakur et al. . | |
| 5,459,480 | 10/1995 | Browning et al. . | |
| 5,486,126 | 1/1996 | Cathey et al. . | |
| 5,503,582 | 4/1996 | Cathey, Jr. et al. . | |
| 5,525,868 | 6/1996 | Browning . | |
| 5,532,177 | 7/1996 | Cathey . | |
| 5,676,853 | 10/1997 | Alwan | 216/11 |
| 5,695,658 | 12/1997 | Alwan | 216/42 |
| 5,753,130 | 5/1998 | Cathey et al. | 216/11 |
| 5,811,020 | 9/1998 | Alwan | 216/42 |
| 5,817,373 | 10/1998 | Cathey et al. | 427/458 |

*Primary Examiner*—Matthew Smith
*Assistant Examiner*—Victor Yevsikov
*Attorney, Agent, or Firm*—Trop, Pruner & Hu, P.C.

[57] ABSTRACT

A method for forming semiconductor devices involves defining a pattern of microspheres on a first structure and transferring that pattern of microspheres to a semiconductor structure. The microspheres may then be used as a mask to define features on the semiconductor structure. In this way, it is possible to form semiconductor devices without necessarily using a stepper. This may result in substantial capital savings in semiconductor manufacturing processes.

23 Claims, 4 Drawing Sheets

METHOD OF PATTERNING A SEMICONDUCTOR DEVICE

BACKGROUND OF THE INVENTION

This invention relates generally to techniques for reproducibly transferring patterns to semiconductor devices and particularly to techniques which do not require the use of expensive steppers or the like. The techniques have applicability, for example, in connection with the formation of field emission displays.

In the manufacture of most modern semiconductor devices, a pattern is repeatedly transferred to a substrate using a device called a photolithographic stepper. The stepper is a highly precise machine which may use ultraviolet light to transfer an image formed on a glass plate called a reticle or mask to the semiconductor substrate. For example, the image may be transferred by shining light through the stepper reticle which has an enlarged version of the desired pattern formed on it. The light pattern created by the reticle pattern causes the photoresist to be exposed in the desired pattern. Photoresist can then be developed and etched depending on whether or not it was exposed to light. The photoresist develops differently based on light exposure, and therefore the pattern formed on the reticle in the stepper can be accurately transferred to the substrate.

In many instances, it may be necessary to transfer a pattern reproducibly to a substrate, but the degree of precision enabled by modern stepper technology may not be absolutely required. Because the stepper equipment is extremely expensive, it would be desirable to develop a process which allows patterns to be transferred without requiring the use of expensive stepper technology.

One approach to avoid a resist mask step is found in U.S. Pat. No. 4,407,695 entitled "Natural Lithographic Fabrication of Microstructures Over Large Areas" to Deckman et al. ("Deckman et al. '695"). Deckman et al. '695 describes forming a mask by depositing an ordered, closely packed monolayer of colloidal particles on a substrate. The particles may be arranged in the monolayer as an array. The array serves as a lithographic mask for etching the substrate.

Another approach to avoid a resist mask step for forming field emitter tips is found in U.S. Pat. No. 5,399,238 entitled "Method of Making Field Emission Tips Using Physical Vapor Deposition of Random Nuclei as Etch Mask" to Kumar ("Kumar '238"). Kumar '238 describes physical vapor deposition of randomly located, discrete nuclei. The nuclei are deposited on an emitter tip material, and form a discontinuous etch mask thereon. Using an ion etch, the emitter tips are formed with aid of the nuclei etch mask.

It would be desirable to have an economical technique for transferring patterns to semiconductor substrates that does not necessitate the large capital investment inherent in stepper technology.

SUMMARY OF THE INVENTION

In accordance with one aspect, a method for forming a semiconductor device includes the step of defining a microsphere pattern by forming a plurality of apertures in the surface of a microsphere supporting structure. The microspheres are deposited randomly on the structure. The microspheres collect in the apertures. The collected microspheres are used as a mask to define features in a semiconductor device.

In accordance with another aspect, a method of forming a field emission display includes the step of forming a pattern of apertures in a particle supporting structure, the apertures arranged in a pattern corresponding to the pattern of emitters in the field emission display. A supporting structure is formed including a semiconductor layer covered by a conducting layer in turn covered by a mask layer. Masking particles are collected in the apertures and transferred to the semiconductor layer. The particles are used as a mask to etch the conductive layer to form a plurality of pillars. The pillars are etched to form a plurality of conically shaped emitters from the conductive layer. A display screen is formed, spaced from the emitters.

In accordance with yet another aspect, a method for forming a semiconductor device includes the step of forming a pattern of apertures in a surface of a microsphere supporting structure. The apertures are filled with microspheres. For example, this could be done using a squeegee. The microspheres are transferred to a structure including a semiconductor layer. The microspheres are used as a mask to define features on said semiconductor layer.

In yet another aspect of the present invention, a method of forming a semiconductor device includes the step of forming a pattern of particles on a first structure. The pattern is transferred to a semiconductor structure which acts as a transfer surface. The particles are used to define features on the semiconductor structure.

DESCRIPTION OF THE PREFERRED EMBODIMENTS

Figure 1:
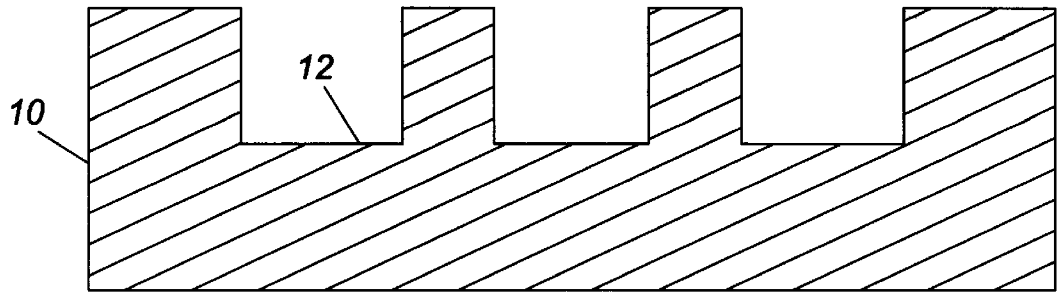
FIG. 1 is a simplified, greatly enlarged cross-sectional view of a microsphere supporting structure.
Figure 2:
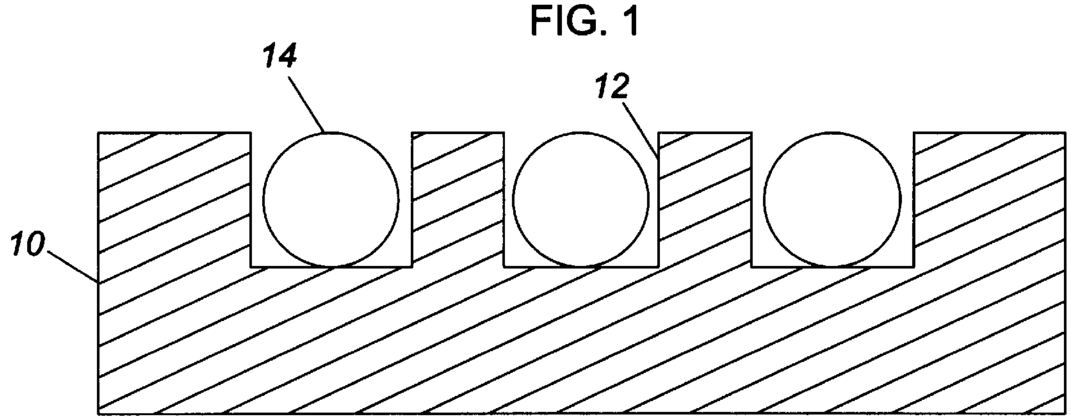
FIG. 2 is a greatly enlarged cross-sectional view of the microsphere supporting structure shown in FIG. 1 with microspheres in position.

Referring to the drawing wherein like reference characters are used for like parts throughout the several views, a microsphere supporting structure 10, shown in FIG. 1, includes a plurality of apertures 12 formed in a surface. The apertures 12 are designed to receive microspheres 14 as shown in FIG. 2.

The microspheres may be commercially available microspheres formed of a variety of substances, including polymers such as polystyrene and silicon dioxide. Microspheres come in a variety of different sizes but generally the microspheres are particles on the order of from 0.01 to 250 microns in diameter. The term "microspheres" is intended to refer to small generally spherical particles of collodial particle size and not to any precise geometrical shape. The microspheres may be suspended in a de-ionized water solution or an isopropyl alcohol solution. Suppliers for such microspheres include Bangs Laboratories, Inc. in Fishers, Ind. 46038 and Interfacial Dynamics Corp. in Portland, Oreg. 97220.

The apertures 12 may be formed by a variety of techniques. They can be formed, for example, by using a conventional stepper and etching techniques to define an appropriate pattern in the surface of the microsphere supporting structure 10. However, advantageously other techniques, not requiring the use of a stepper, may be utilized. Among these techniques is the use of laser machining, ion beam machining and the like. The apertures 12 are generally sized to correspond to the diameter of the desired microspheres 14. The pattern of apertures 12 is dictated by the pattern of features which are desired on a semiconductor device to be made in accordance with the present invention.

The microspheres 14 may be caused to enter the apertures 12 by applying them in a solution near the surface and using a squeegee-type technique to urge the microspheres into the apertures 12. The microspheres 14 may also be positioned in the apertures 12 by simply locating them on structure 10 in the form of a concentrated solution. The solution can then be rinsed, using a gentle spray, leaving microspheres 14 in the apertures 12. With either technique, the microspheres may be applied to the surface randomly, without the need for initial precise positioning. The apertures may then be used to effectively select the appropriately located, randomly deposited microspheres.

If the microspheres 14 are of a contrasting color to the microsphere supporting structure 10, it is easy to determine whether or not all of the apertures 12 have been filled.

Figure 3:
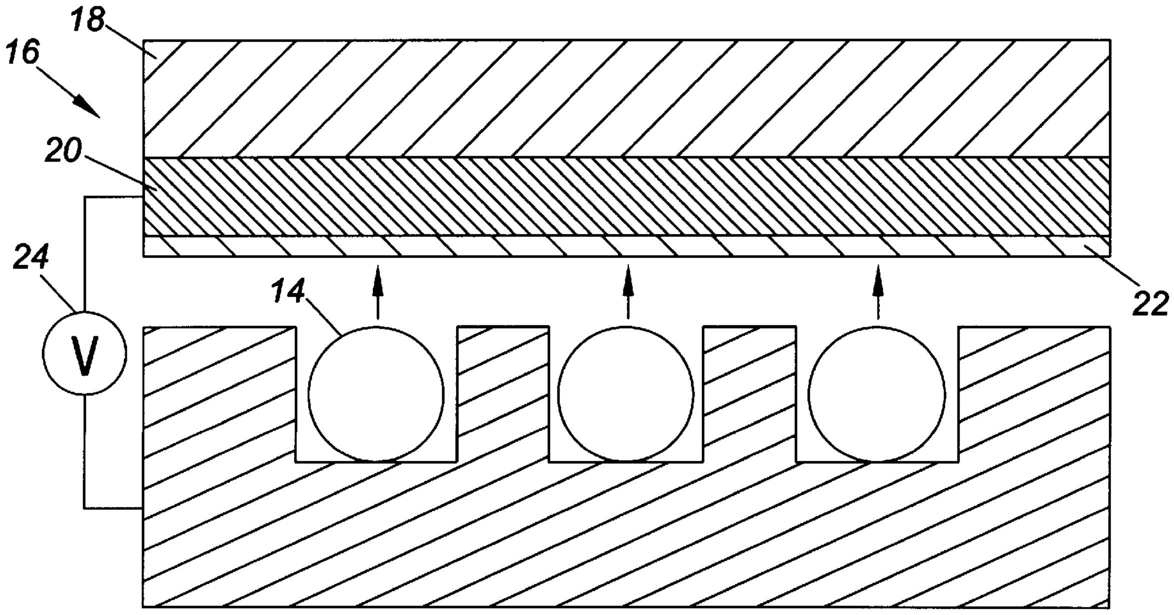
FIG. 3 is a greatly enlarged cross-sectional view showing the transfer of microspheres from the microsphere supporting structure to a semiconductor substrate.

The microsphere supporting structure 10 is then placed in close proximity to a semiconductor structure 16, as shown in FIG. 3. The microspheres, in the desired pattern defined by the apertures 12, contact and adhere to the upper surface 22 of the semiconductor structure 16. This transfer may be facilitated by placing opposite potentials on the microsphere supporting structure 10 and the semiconductor structure 16. Advantageously, the structure 19 is conductive and the layer 20 of the semiconductor device structure 16 is also conductive. In accordance with one aspect of the present invention, the layer 20 is formed of doped polysilicon material. The material 18 may be a p- or n-type semiconductor material. The layer 22 may be a dielectric, such as oxide, or a metal, such as nickel.

The electric field causes the microspheres 14 to move in the direction, indicated by the arrows in FIG. 3, from the supporting structure 10 to the structure 16 under the influence of the potential 24. The microspheres 14 may be transferred using surface tension as well. In this mode, a liquid exists in the interface between the semiconductor structure 16 and the microsphere supporting structure 10. The surface tension causes the microspheres to adhere to the semiconductor structure 16. In addition, a dry transfer may be achieved with or without the use of an electric potential, where the attraction between the micropheres to a particular surface is sufficient to transfer the particles. In the dry transfer, no liquid is used in the interface and the two surfaces may come into contact.

Figure 4:
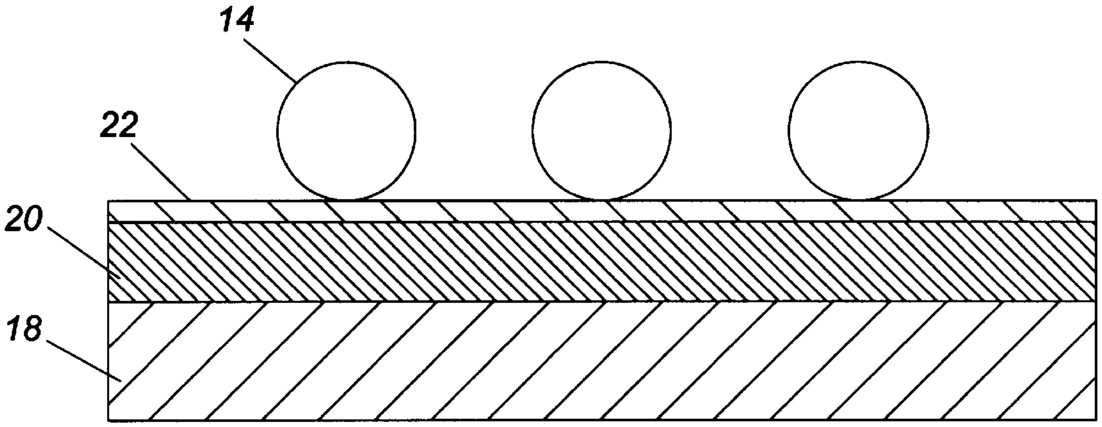
FIG. 4 shows the microspheres in position on the semiconductor substrate.

In any case, the microspheres 14 are transferred onto the surface 22 of the semiconductor structure 16 as shown in FIG. 4 and thereafter the structure 16 may be inverted. The attraction between the microspheres 14 and the dielectric layer 22 may be substantial enough that no additional adherence is necessary to connect the microspheres to the semiconductor structure 16. However, in many instances it may be desirable to heat the semiconductor structure 16 to melt the microspheres 14 to form hemispheres 26 on the surface of the semiconductor structure 16. Obviously, the hemispheres 26 are still maintained in substantially the same pattern defined by the apertures 12 in the microsphere supporting structure 10.

Figure 5:
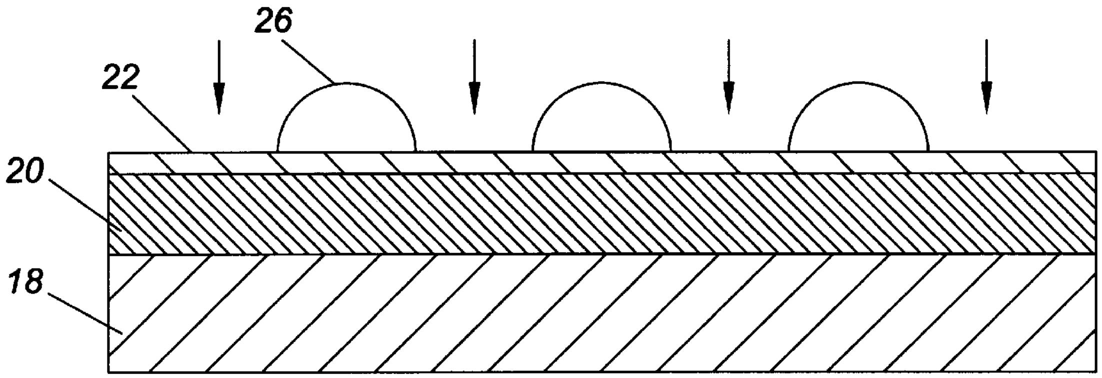
FIG. 5 is a greatly enlarged cross-sectional view showing the microspheres after they have been melted on the semiconductor substrate.
Figure 6:
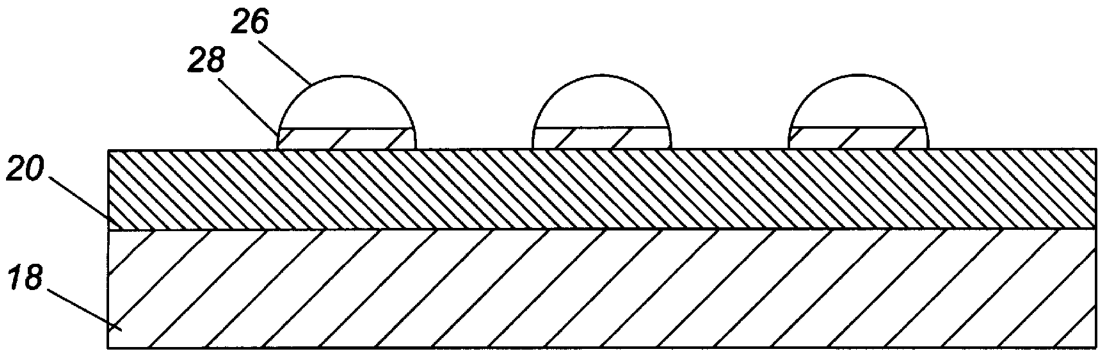
FIG. 6 is a greatly enlarged cross-sectional view of the semiconductor substrate after etching of a hard mask.

The dielectric layer 22 may then be etched using directional etching techniques such as a dry anisotropic etch, as shown in FIG. 5. As a result, the dielectric layer 22 is removed everywhere except for the remaining portions 28 shielded underneath each hemisphere 26, as shown in FIG. 6. By using an etchant which does not substantially attack the hemispheres 26, the surface of the layer 20 may be exposed everywhere where the layer 20 is uncovered by the hemispheres 26. In this way, the desired pattern has been transferred to the semiconductor structure 16, now in the form of the mask formed by the remaining dielectric 28 and the hemispheres 26.

Figure 7:
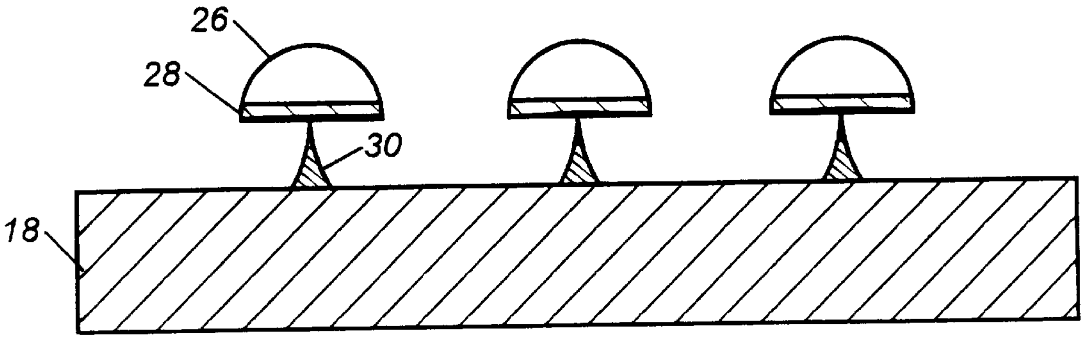
FIG. 7 is a greatly enlarged cross-sectional view of a semiconductor substrate after emitters have been etched.

Thereafter, the mask can be utilized to form additional features in the semiconductor structure 16. For example, etching techniques may be utilized to form conically shaped emitters 30, as shown in FIG. 7. The etching techniques utilized to form the structures are described in greater detail in U.S. Pat. No. 5,532,177 issued on Jul. 2, 1996 to David A. Cathey, hereby expressly incorporated by reference herein.

Figure 8:
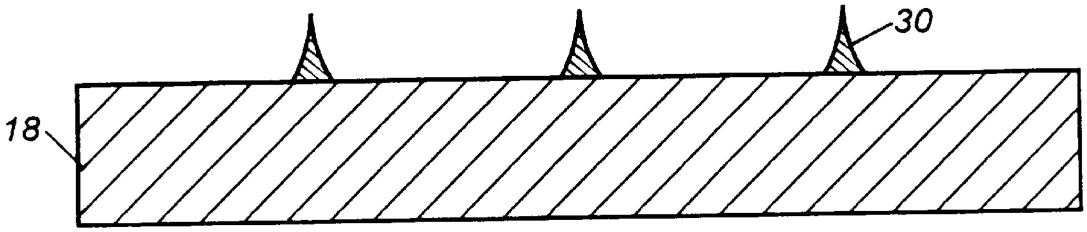
FIG. 8 shows emitters after the masking structures have been removed.

The emitters 30 may be etched by a variety of etching techniques with undercutting influenced by the doping concentration of the polysilicon layer 20. Thereafter, the masking layer formed of the hemispheres 26 and dielectric remnants 28 may be removed using conventional wet etching techniques. The resulting emitters 30, shown in FIG. 8, may be sharpened using oxidation techniques as described in the aforementioned patent.

Figure 9:
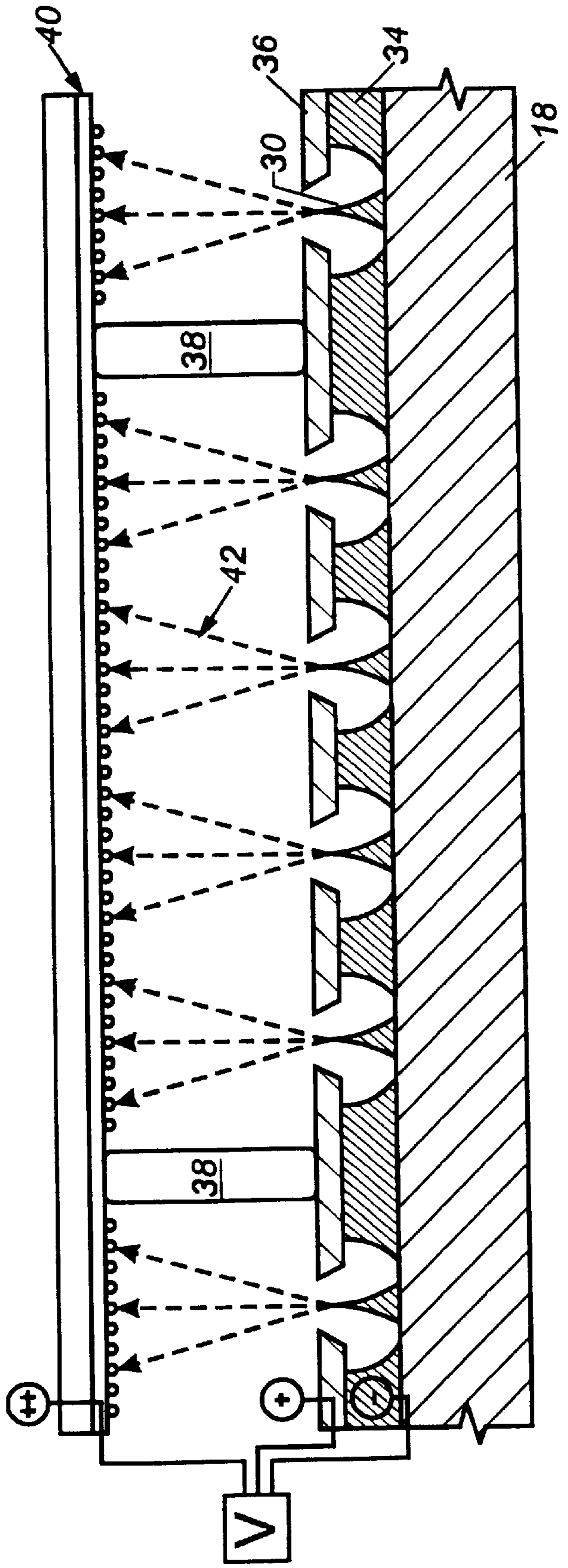
FIG. 9 is a schematic, enlarged cross-sectional view showing one embodiment of a field emission display using the emitters shown in FIG. 8.

As shown in FIG. 9, the emitters 30 may be part of a field emission display 32. The field emission display 32 includes dielectric regions 34, an extractor 36, spacers 38, and a luminescent screen 40. Techniques for forming the field emission displays are described in U.S. Pat. Nos. 5,151,061, 5,186,670 and 5,210,472, hereby expressly incorporated by reference herein. The emitters 30 emit electrons 42 which strike the screen 40 and cause images to be seen by a user on the opposite side of the screen 40.

The positioning of the microspheres is advantageously controlled. Good electron beam optics from the field emitter tips requires that the tips not be too close to one another. If two microspheres are touching when the mask is formed, this would generate two adjacent field emission tips. The gate electrode is a concentric ring about each emitter tip. Otherwise, the applied voltage generates electric fields which are not radially symmetrical. This causes high turn on voltages, high grid current and poorly collimated electron beam optics.

The first two symptons cause high power consumption, poor stability, and poor uniformity, in the resulting display. Poorly collimated beams lead to poor image resolution and color washing in the display.

It is desirable to have a large number of emitter tips per pixel to enhance current and brightness as well as provide redundancy for robustness and lifetime. The trade-off is that the tips must be far away from each other so that they do not adversely effect the electric field.

With techniques described herein, it is possible to form a variety of semiconductor devices without the necessity of using a stepper. While one technique is to use a stepper in connection with the formation of the apertures 12, it should be understood that once the microsphere supporting structure 10 has been formed in this way, it is no longer necessary to use a stepper in subsequent manufacturing processes. Thus the need for a dedicated stepper to support the manufacturing process is effectively eliminated. In many instances, the need for a stepper can be completely eliminated, in accordance with the present invention, resulting in substantially diminished capital equipment costs associated with semiconductor operations.

Instead of using a flat microsphere supporting structure, it is also possible to use a drum-shaped micro-sphere supporting structure (not shown) having a plurality of apertures formed in the surface of the drum. The micro-spheres may be applied to the surface of the drum in liquid form and then squeegeed into the surface apertures using a squeegee-type technique that is described above. As the drum rotates, a semiconductor structure can be passed underneath the drum. The microspheres, formed into the pattern of apertures in the drum, may be transferred into the semiconductor substrate in a continuous fashion.

With these techniques the micropheres 14 can be used to create a mask which creates features on a semiconductor structure. The diameter and arrangement of the microspheres 14 corresponds to the resulting features formed in the semiconductor device. For example, microspheres 14 on the order of about one to two microns may be used to form emitters of about one micron in diameter at their thickest point.

While the present invention has been described with respect to a limited number of embodiments, those skilled in the art will appreciate a number of modifications and variations therein and it is intended that the appended claims cover all such modifications and variations that fall within the true spirit and scope of the present invention.

What is claimed is:

1. A method of forming a semiconductor device comprising:

defining a microsphere pattern by forming a plurality of cavities in the surface of a microsphere supporting structure;

depositing microspheres randomly on said structure;

collecting microspheres in said cavities;

using said collected microspheres as a mask to define features in said semiconductor device.

2. The method of claim 1 including the step of transferring said microspheres from said structure to a semiconductor layer where said microspheres act as a mask to form said semiconductor device and wherein said microspheres are transferred to the semniconductor layer using a liquid interface between the microsphere supporting structure and the receiving semiconductor layer.

3. The method of claim 1 including the step of transferring said microspheres from said structure to a semiconductor layer Where said microspheres act as a mask to form said semicondutor device and wherein said microspheres are transferred by placing opposite potentials on the microsphere supporting structure and the semiconductor layer.

4. The method of claim 1 including the step of transferring said microspheres from said structure to a semiconductor layer where said microspheres act as a mask to form said semiconductor device and including the step of heating said microspheres so that said microspheres melt in position on said semiconductor layer.

5. The method of claim 1 including the step of transferring said microspheres from said structure to a semiconductor layer where said microspheres act as a mask to form said semiconductor device and including the step of etching said semiconductor layer using said microspheres as a mask.

6. The method of claim 1 including the step of transferring said microspheres from said structure to a semiconductor layer where said microspheres act as a mask to form said semiconductor-device and including the step of forming said semiconductor layer by depositing a conductive layer on a base layer and forming a mask layer on top of said conductive layer.

7. The method of claim 6 including the step of etching said conductive layer using said microspheres as a mask to cause undercutting underneath said mask so as to form conical conductive elements on said base layer.

8. A method for forming a semiconductor device comprising the steps of:

forming a pattern of apertures in a surface of a microsphere supporting structure;

filling said apertures with microspheres;

transferring said microspheres to a structure including a semiconductor layer; and using said microspheres as a mask to define features on said semiconductor layer.

9. The method of claim 8, wherein said microspheres are caused to enter said apertures by applying said microspheres to the surface of said microsphere supporting structure in a liquid suspension and squeegeeing said microspheres into said apertures.

10. The method of claim 8 including the step of securing said microspheres to said semiconductor layer by melting said microspheres atop said semiconductor layer.

11. The method of claim 10 including the step of etching said semiconductor layer using said melted microspheres as a mask.

12. A method of forming a semiconductor device comprising:

forming a pattern of particles on a first structure;

transferring said pattern to a semiconductor structure; and using said particles as a mask to define features on said semiconductor structure.

13. The method of claim 12 including the step of securing said particles to said semiconductor structure.

14. The method of claim 12 including the step of using said particles to form part of an etching mask on said semiconductor structure.

15. The method of claim 12 including the step of placing particles atop said semiconductor structure without any adhering medium to secure said particles to said structure.

16. The method of claim 12 including the step of melting said particles to secure them to said semiconductor structure.

17. The method of claim 12 including the steps of forming a plurality of particle holding apertures in a transfer device, inserting particles into each of said apertures and transferring said particles from said apertures to said semiconductor structure in said pattern.

18. The method of claim 12 including the step of using particles having at least one dimension in common with features to be defined on said semiconductor structure.

19. The method of claim 18 including the step of using microspheres as said particles.

20. A method of forming a semiconductor device comprising:

defining a microsphere pattern by forming a plurality of apertures in the surface of a microsphere supporting structure;

depositing microspheres randomly on said structure;

collecting microspheres in said aperture; and transferring said microspheres from said structure to a semiconductor layer where said microspheres act as a mask to form said semiconductor device.

21. The method of claim 20 wherein said microspheres are transferred to the semiconductor layer using a liquid interface between the microsphere supporting structure and the receiving semiconductive layer.

22. The method of claim 20 wherein said microspheres are transferred by placing opposite potentials on the microsphere supporting structure and the semiconductor layer.

23. The method of claim 20 including heating said microspheres so that said microspheres melt in position on said semiconductor layer.

* * * * *

UNITED STATES PATENT AND TRADEMARK OFFICE

CERTIFICATE OF CORRECTION

PATENT NO. : 6,083,767
DATED : July 4, 2000
INVENTOR(S) : Kevin Tjaden and David H. Wells It is certified that error appears in the above-identified patent and that said Letters Patent is hereby corrected as shown below:

Column 1,
Line 2, please insert the following:
STATEMENT AS TO FEDERALLY SPONSORED RESEARCH This invention was made with United States Government support under contract no. DABT63-93-C-0025 awarded by the Advanced Research Projects Agency (ARPA). The United States Government has certain rights in this invention.

Signed and Sealed this

Twelfth Day of February, 2002

*Attest:*

JAMES E. ROGAN
*Director of the United States Patent and Trademark Office*

*Attesting Officer*